(12) United States Patent
Lee et al.

(10) Patent No.: US 11,557,616 B2
(45) Date of Patent: Jan. 17, 2023

(54) IMAGE SENSING DEVICE

(71) Applicant: SK hynix Inc., Icheon-si (KR)

(72) Inventors: Ho Ryeong Lee, Icheon-si (KR); Dong Hyun Woo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 45 days.

(21) Appl. No.: 16/673,747

(22) Filed: Nov. 4, 2019

(65) Prior Publication Data

US 2021/0036039 A1 Feb. 4, 2021

(30) Foreign Application Priority Data

Jul. 29, 2019 (KR) .................. 10-2019-0091650

(51) Int. Cl.
*H01L 27/14* (2006.01)
*H01L 27/146* (2006.01)

(52) U.S. Cl.
CPC .. *H01L 27/14616* (2013.01); *H01L 27/14614* (2013.01); *H01L 27/14621* (2013.01); *H01L 27/14627* (2013.01)

(58) Field of Classification Search
CPC combination set(s) only.
See application file for complete search history.

(56) References Cited

U.S. PATENT DOCUMENTS

| 2016/0013240 A1* | 1/2016 | Jung | ................. H01L 27/14614 257/292 |
| 2016/0150168 A1 | 5/2016 | Oh | |
| 2021/0255282 A1* | 8/2021 | Katayama | ......... H01L 27/14856 |

FOREIGN PATENT DOCUMENTS

| CN | 102196198 A | 9/2011 |
| CN | 106847838 A | 6/2017 |
| JP | 2007088305 A | 4/2007 |
| KR | 10-2017-0065935 | 6/2017 |

* cited by examiner

*Primary Examiner* — Moin M Rahman
(74) *Attorney, Agent, or Firm* — Perkins Coie LLP

(57) ABSTRACT

An image sensing device includes a photoelectric conversion element, a floating diffusion (FD) region, and a transfer gate. The photoelectric conversion element is disposed in a substrate, and generates photocharges in response to incident light. The floating diffusion (FD) region is disposed over the photoelectric conversion element, and stores the photocharges generated by the photoelectric conversion element. The transfer gate transfer the photocharges generated by the photoelectric conversion element to the floating diffusion (FD) region in response to a transmission signal. The transfer gate includes a horizontal gate disposed over the photoelectric conversion element, and a vertical gate coupled to the horizontal gate. The vertical gate is positioned at a side of the photoelectric conversion element, and surrounds the photoelectric conversion element.

20 Claims, 14 Drawing Sheets

IMAGE SENSING DEVICE

CROSS-REFERENCE TO RELATED APPLICATION

This patent document claims the priority and benefits of Korean patent application No. 10-2019-0091650, filed on Jul. 29, 2019, which is hereby incorporated in its entirety by reference.

TECHNICAL FIELD

The technology and implementations disclosed in this patent document generally relate to an image sensing device.

BACKGROUND

An image sensing device is a semiconductor device for converting an optical image into electrical signals. With increasing development of computer and communication industries, demand for high-quality and high-performance image sensors is rapidly increasing in various fields, for example, in digital cameras, camcorders, personal communication systems (PCSs), game consoles, surveillance cameras, medical micro-cameras, robots, etc.

SUMMARY

Various embodiments of the disclosed technology relate to an image sensing device including a transfer transistor with a gate structure to minimize a transmission (Tx) delay.

In accordance with an embodiment of the disclosed technology, an image sensing device may include a photoelectric conversion element disposed in a substrate, and configured to generate photocharges in response to incident light, a floating diffusion (FD) region disposed over the photoelectric conversion element, and configured to store the photocharges generated by the photoelectric conversion element, and a transfer gate configured to transfer the photocharges generated by the photoelectric conversion element to the floating diffusion (FD) region in response to a transmission signal. The transfer gate may include a horizontal gate disposed over the photoelectric conversion element, and a vertical gate disposed a side of the photoelectric conversion element to surround the photoelectric conversion element.

In accordance with another embodiment of the disclosed technology, an image sensing device may include a photoelectric conversion element disposed in a substrate, a floating diffusion (FD) region disposed over the photoelectric conversion element, and a transfer gate disposed to surround top and side surfaces of the photoelectric conversion element and surround side surfaces of the floating diffusion (FD) region, the transfer gate configure to transfer photocharges generated by the photoelectric conversion element to the floating diffusion (FD) region in response to a transmission signal.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
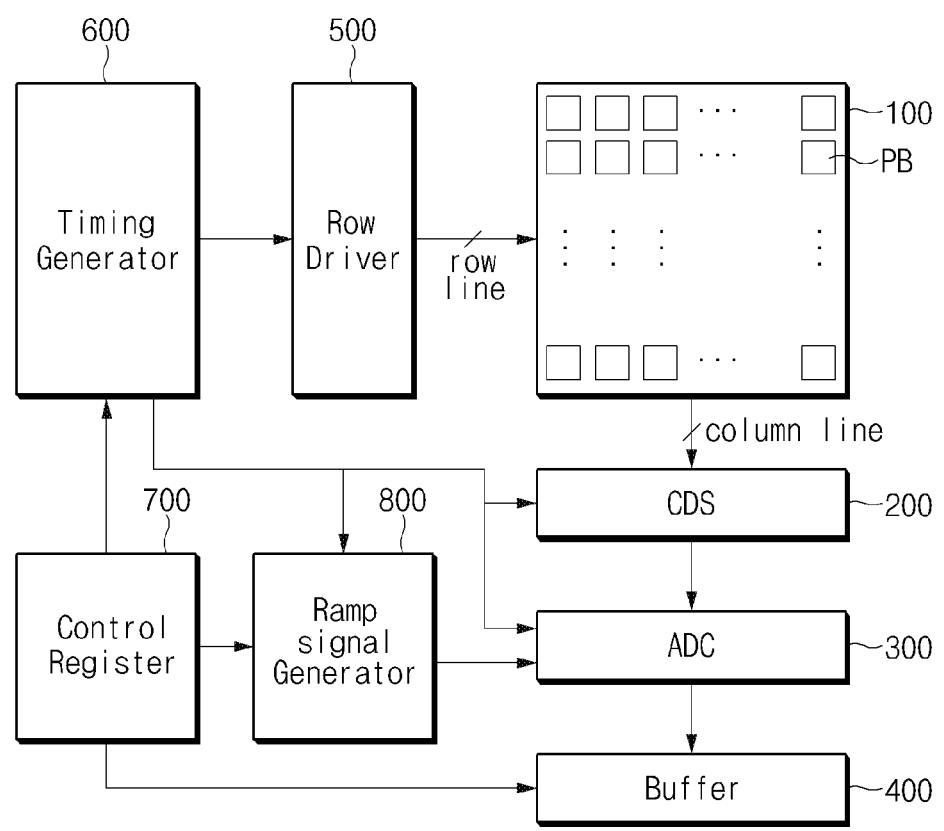
FIG. 1 is a block diagram illustrating an example image sensing device based on some implementations of the disclosed technology.

FIG. 1 is an example block diagram illustrating an image sensor based on some implementations of the disclosed technology.

Referring to FIG. 1, the image sensor 100 may include a pixel array 100, a correlated double sampler (CDS) circuit 200, an analog-to-digital converter (ADC) circuit 300, a buffer 400, a row driver 500, a timing generator 600, a control register 700, and a ramp signal generator 800.

The pixel array 100 may include a plurality of pixel blocks (PBs) arranged in a matrix shape including rows and columns. Each pixel block (PB) may include a plurality of unit pixels (PXs) configured to share drive transistors with each other. For example, each pixel block (PB) may be formed as a shared pixel structure in which four unit pixels (PXs) share a reset transistor, a source follower transistor, and a selection transistor. Each unit pixel includes a photoelectric conversion element for generating photocharges through conversion of an incident light signal received from the outside, a floating diffusion (FD) region for temporarily storing the photocharges generated by the photoelectric conversion element, and a transfer gate for transmitting the photocharges generated by the photoelectric conversion element to the floating diffusion (FD) region. In some implementations, the photoelectric conversion element includes photosensing elements, for example, photodiodes, photogates, phototransistors, photoconductors, or other photosensitive structures capable of generating photocharges. At least one of the unit pixels includes a transfer gate which is designed to surround not only a top surface of the photoelectric conversion element, but also side surfaces of the photoelectric conversion element. In some implementations, the transfer gate may have a bell shape. More detailed descriptions of the transfer gate will be given with reference to FIGS. 3 and 4. Each unit pixel block (PB) may output a pixel signal corresponding to electrical image signals of each unit pixel to the CDS circuit 200 through column lines. The pixel blocks (PBs) may be coupled to row lines and column lines.

The correlated double sampler (CDS) circuit 200 may hold and sample the pixel signals received from the pixel blocks (PBs) of the pixel array 100. For example, the correlated double sampler (CDS) circuit 200 may perform sampling of a reference voltage level and a voltage level of the received electrical image signal in response to a clock signal received from the timing generator 600, and may transmit an analog signal corresponding to a difference between the reference voltage level and the voltage level of the received electrical image signal to the analog-to-digital converter (ADC) circuit 300.

The analog-to-digital converter (ADC) circuit 300 may compare a ramp signal received from the ramp signal generator 800 with a sampling signal received from the correlated double sampler (CDS) circuit 200, and may thus output a comparison signal indicating the result of comparison between the ramp signal and the sampling signal. The analog-to-digital converter (ADC) circuit 300 may count a level transition time of the comparison signal in response to a clock signal received from the timing generator 600, and may output a count value indicating a count of the level transition time to the buffer 400.

The buffer 400 may store each of the digital signals received from the analog-to-digital converter (ADC) circuit 300, may sense and amplify each of the digital signals, and may output each of the amplified digital signals. Therefore, the buffer 400 may include a memory (not shown) and a sense amplifier (not shown). The memory may store the count value, and the count value may be associated with output signals of the plurality of unit pixels (PXs). The sense amplifier may sense and amplify each count value received from the memory.

The row driver 500 may drive pixel blocks of the pixel array 100 in response to an output signal of the timing generator 600. For example, the row driver 500 may generate a control signal capable of selecting at least one of the plurality of row lines. The control signal may include a selection signal for controlling the selection transistor and a transmission (Tx) signal for controlling transfer gates.

The timing generator 600 may generate a timing signal to control the row driver 500, the correlated double sampler (CDS) circuit 200, the analog-to-digital converter (ADC) circuit 300, and the ramp signal generator 800.

The control register 700 may generate control signals to control the ramp signal generator 800, the timing generator 600, and the buffer 400.

The ramp signal generator 800 may generate a ramp signal to control an image signal received from the buffer 400 in response to a control signal received from the timing generator 600.

Figure 2:
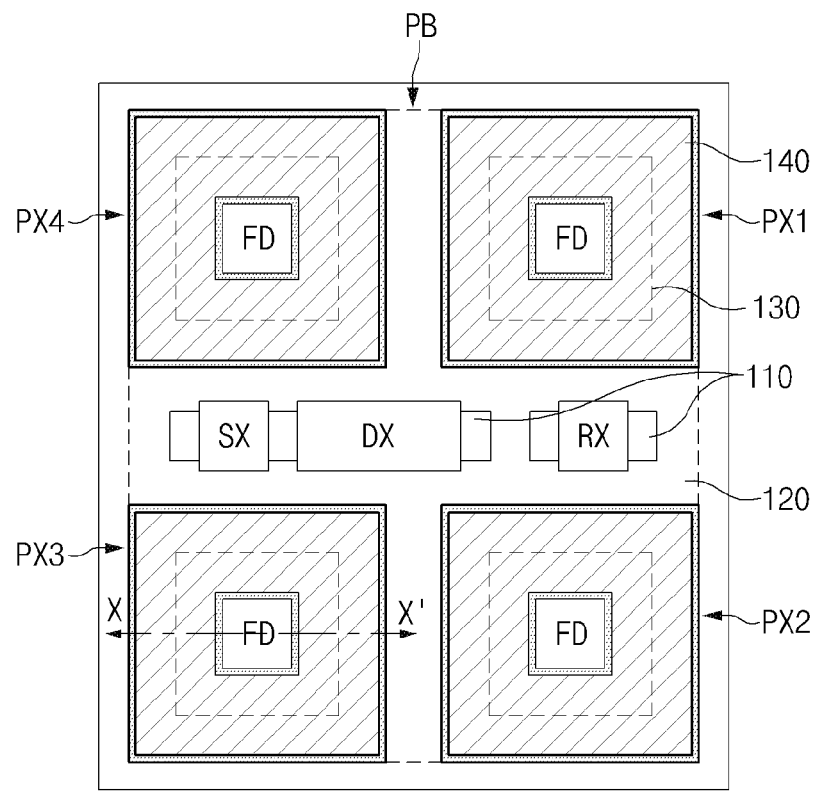
FIG. 2 is an example plan view illustrating pixel blocks formed in a pixel array shown in FIG. 1.
Figure 3:
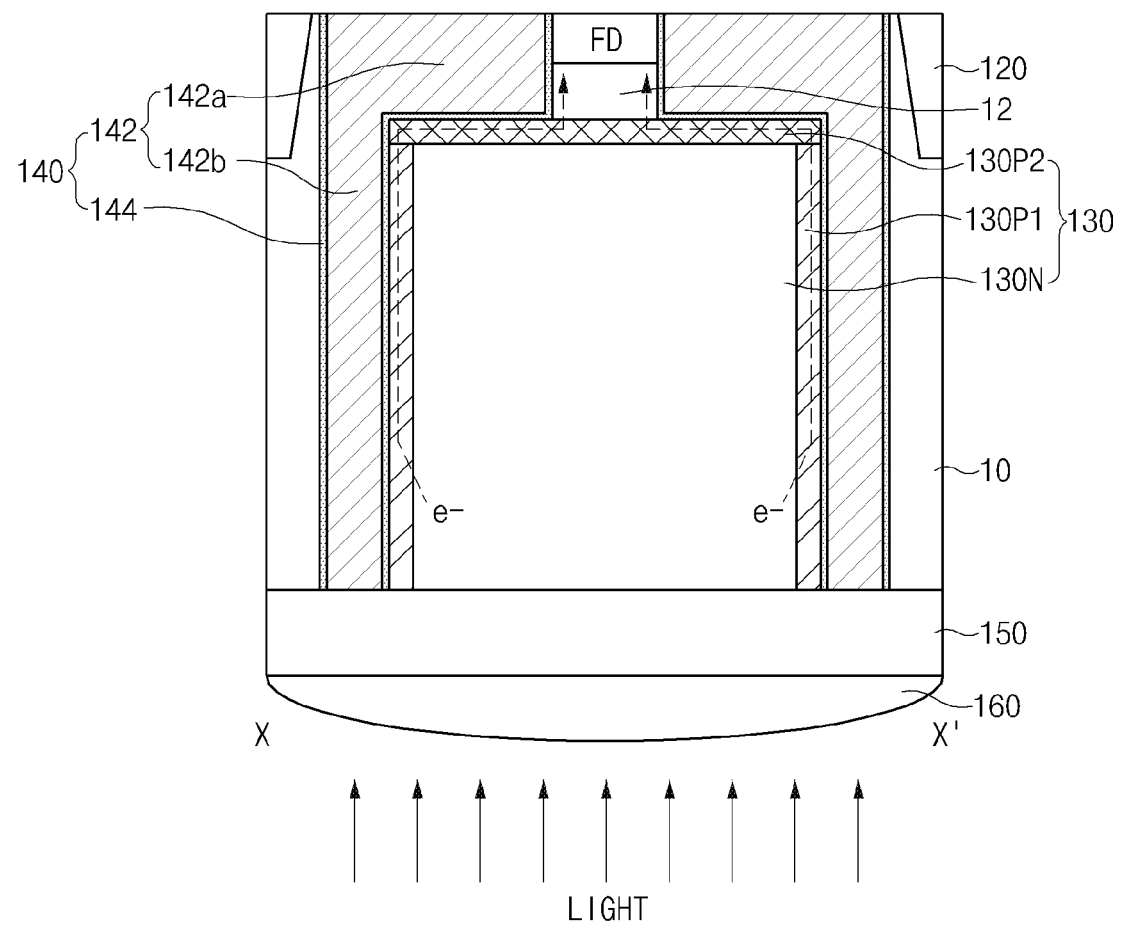
FIG. 3 is an example cross-sectional view illustrating a unit pixel taken along the line X-X' shown in FIG. 2.

FIG. 2 is an example plan view illustrating pixel blocks formed in the pixel array shown in FIG. 1. FIG. 3 is an example cross-sectional view illustrating the unit pixel taken along the line X-X' shown in FIG. 2.

Although FIG. 3 illustrates only one unit pixel among four unit pixels PX1 to PX4 contained in the pixel block, the four unit pixels PX1 to PX4 may be identical in structure to each other.

Referring to FIGS. 2 and 3, each pixel block PB may be formed as a shared pixel structure in which four unit pixels PX1 to PX4 share a reset transistor RX, a source follower transistor DX, and a selection transistor SX. The reset transistor RX, the source follower transistor DX, and the selection transistor SX may be arranged in a first direction (e.g., an X-axis direction). Thus, the reset transistor RX, the source follower transistor DX, and the selection transistor SX may be arranged to traverse the pixel block PB. In some implementations, on one side of the reset transistor RX, the source follower transistor DX, and the selection transistor SX, the unit pixels PX1 and PX4 are arranged and on the other side of the reset transistor RX, the source follower transistor DX, and the selection transistor SX, the unit pixels PX2 and PX3 are arranged.

An upper region of the substrate 10 may include an active region 110 in which the transistors RX, DX, and SX are formed, and a device isolation structure 120 for defining a pixel region in which the unit pixels PX1 to PX4 are formed. The device isolation structure 120 may include a shallow trench isolation (STI) structure in which a trench formed by etching the substrate 10 to a predetermined depth is buried with an insulation material, or may include an impurity region formed by implanting impurities in the substrate 10 to a predetermined depth.

The substrate 10 may include a semiconductor substrate provided with P-type impurities. The semiconductor substrate may be in a monocrystalline state, and may include a silicon-containing material. The substrate 10 may be a thin film substrate 10 that is formed as a thin film through a thinning process, or may include an epitaxial layer formed through epitaxial growth. For example, the substrate 10 may be a bulk-silicon substrate 10 that is formed as a thin film through the thinning process.

Each of the unit pixels PX1 to PX4 may include a photoelectric conversion element 130, a floating diffusion (FD) region, a transfer gate 140, a color filter layer 150, and a microlens 160.

The photoelectric conversion element 130 may convert incident light that has transmitted the microlens 160 and the color filter layer 150 into photocharges. The photoelectric conversion element 130 may include an organic or inorganic photosensing element. The photoelectric conversion element 130 may be formed over the substrate 10, and may include a stacked structure in which impurity regions having complementary conductivities are stacked. For example, the photoelectric conversion element 130 may include a stacked structure of a first impurity region 130N, a second impurity region 130P1, and a third impurity region 130P2. The first impurity region 130N may be an N-type impurity region, and each of the second impurity region 130P1 and the third impurity region 130P2 may be a P-type impurity region. The second impurity region 130P1 may be located at a side part of the first impurity region 130N so as to surround side surfaces of the first impurity region 130N. The third impurity region 130P2 may be disposed over the first impurity region 130N. The second impurity region 130P1 and the third impurity region 130P2 may have different impurity densities. The first impurity region 130N may include a doping profile that is uniform in a vertical direction, or may include a doping profile that changes in the vertical direction. For example, the first impurity region 130N may have a doping profile whose impurity doping density increases as being closer to the floating diffusion (FD) region.

The floating diffusion (FD) region may be used to temporarily store photocharges generated by the photoelectric conversion element 130 and transferred through the transfer gate 140 from the photoelectric conversion element 130. The floating diffusion (FD) region may be an N-type impurity region. The floating diffusion (FD) region may be formed over the photoelectric conversion element 130 so as to vertically overlap with a center part of the photoelectric conversion element 130 within the substrate 10. For example, the floating diffusion (FD) region may be independently formed for each of the unit pixels PX1 to PX4. In each of the unit pixels PX1 to PX4, the floating diffusion (FD) region may be located at the center part of the upper region of the corresponding unit pixel. The floating diffusion (FD) region may have a smaller width than that of the photoelectric conversion element 130. As shown in FIG. 3, a pillar region 12 may be interposed between the floating diffusion (FD) region and the photoelectric conversion element 130. The pillar region 12 may have a smaller width than that of the photoelectric conversion element 130. The pillar region 12 may not include P-type impurities therein to facilitate the movement of the photocharges from the photoelectric conversion element 130 to the floating diffusion (FD) region.

The transfer gate 140 may allow photocharges generated by the photoelectric conversion element 130 to be transmitted to the floating diffusion (FD) region upon receiving a transmission signal. For example, when a positive voltage is applied to the transfer gate 140, photocharges generated in the first impurity region 130N may move to the floating diffusion (FD) region after passing through the second impurity region 130P1, the third impurity region 130P2, and the pillar region 12. The movement of the photocharges from the photoelectric conversion element 130 to the floating diffusion (FD) region is shown with the arrow in FIG. 3. Since P-type impurities are not contained in the pillar region 12, a resistance value of the pillar region 12 is reduced, so that the photocharges can more easily move to the floating diffusion (FD) region.

The transfer gate 140 may include a gate electrode 142, and a gate insulation film 144 formed over the gate electrode 142. In some implementations, the gate electrode 142 according to the disclosed technology may include a horizontal gate electrode 142a and a vertical gate electrode 142b.

The horizontal gate electrode 142a may be disposed over the photoelectric conversion element 130. The horizontal gate electrode 142a may be formed in a shape that surrounds the floating diffusion (FD) region when viewed in a plane (e.g., a plane that is perpendicular to the view shown in FIG. 3). Thus, with respect to the photoelectric conversion element 130, the floating diffusion (FD) region may be located at a center region and the horizontal gate electrode 142a may be in a peripheral region. For example, the horizontal gate electrode 142a may be formed in a flat-plate structure having a particular thickness and a through-hole that is formed at its center. The horizontal gate electrode 142a may be disposed over the photoelectric conversion element 130 so as to cover a top surface of the photoelectric conversion element 130. The floating diffusion (FD) region may be disposed in the through-hole of the horizontal gate electrode 142a. In some implementations, the floating diffusion (FD) region may be disposed to fill a part of the through-hole of the horizontal gate electrode 142 and the pillar region 12 may be disposed to fill a remaining part of the through-hole of the horizontal gate electrode 142. In some implementations, the gate insulation film 144 may be disposed along at least a part of the boundary of the horizontal gate electrode. The floating diffusion (FD) region may be disposed so as to contact the gate insulation film 144. The top surface of the horizontal gate electrode 142a and the top surface of the floating diffusion (FD) region may be formed in the substantially same plane.

The vertical gate electrode 142b may extend in a vertical direction. The top surface of the vertical gate electrode 142b may be in contact with the horizontal gate electrode 142a and the bottom surface of the vertical gate electrode 142b may be in contact with the color filter layer 150. For example, the vertical gate electrode 142b may be formed in a shape that surrounds the photoelectric conversion element 130 when viewed in a plane (e.g., a plane that is perpendicular to the view in FIG. 3), and may be formed in a barrier shape that extends perpendicular to the horizontal gate electrode 142a when viewed in a vertical plane. The vertical gate electrode 142b may extend in a vertical direction in a manner that the bottom surface of the vertical gate electrode 142b is at a same level of the bottom surface of the first impurity region 130N. The vertical gate electrode 142b may be formed to pass through the substrate 10.

The horizontal gate electrode 142a and the vertical gate electrode 142b may be formed in a bell shape to surround the photoelectric conversion element 130, the pillar region 12, and the floating diffusion (FD) region. In this case, the floating diffusion (FD) region may be located at or around a top of the bell shape. The top surface of the photoelectric conversion element 130 is covered by the horizontal gate electrode 142 and side surfaces of the photoelectric conversion element 130 is covered by the vertical gate electrode 142b.

The gate electrode 142 may include a silicon-containing semiconductor material (e.g., polysilicon) or a metal material.

The gate insulation film 144 may be formed along the boundary of the transfer gate 140 except top and bottom surfaces of the substrate 10. The gate insulation film 144 may be formed between the gate electrode 142 and each of the impurity regions 130P1 and 130P2, such that the gate insulation film 144 can contact each of the second impurity region 130P1 and the third impurity region 130P2. In addition, the gate insulation film 144 may be formed between the gate electrode 142 and the floating diffusion (FD) region and between the gate electrode 142 and the pillar region 12, such that the gate insulation film 144 may contact the floating diffusion (FD) region and the pillar region 12. The gate insulation film 144 may include at least one of an oxide material, a nitride material, or an oxynitride material.

The color filter layer 150 may be formed on the bottom surface of the substrate 10 that is opposite to the top surface of the substrate on which the floating diffusion (FD) region is disposed. The color filter layer 150 may perform filtering of visible light from incident light received from the microlens 160, so that the visible light can pass through the color filter layer 150. The color filter layer may be formed for each of the unit pixels PX1 to PX4. For example, the color filter layer 150 of each of the unit pixels PX1 to PX4 may be any one of a red filter R, a green filter G, or a blue filter B. Each red filter (R) may transmit only red light from among visible light. Each green filter (G) may transmit only green light from among visible light. Each blue color filter (B) may transmit only blue light from among visible light. Alternatively, the color filter layer 150 of each of the unit pixels PX1 to PX4 may be any one of a cyan filter, a yellow filter, or a magenta filter.

The microlens 160 may be disposed on the color filter 150. The microlens 160 may focus incident light received from an external part, and may transmit the focused incident light to the color filter 150.

Although FIG. 3 illustrates the cross-sectional view of the unit pixel taken along the X-X' line, a cross-sectional view of the unit pixel taken along another line perpendicular to the X-X' line may also be substantially identical in structure to that as shown in FIG. 3.

Although FIG. 2 illustrates the unit pixel formed in a planar square shape as shown in FIG. 2, other implementations are also possible. Thus, in some implementations, the unit pixel can be formed in various shapes such as a circle, polygon, etc.

Although FIG. 3 illustrates the P-type impurity region formed on an internal side of the transfer gate 140, other implementations are also possible. Thus, in some implementations, the P-type impurity region such as the second impurity region 130P1 and the third impurity region 130P2 can be formed on an external side of the transfer gate 140 to contact the transfer gate 140.

The disclosed technology provides the image sensing device including the transfer gate 142 which has two parts 142a and 142b. One of the two parts, i.e., the horizontal gate electrode 142a, is formed over the top surface of the first impurity region 130N and extends along the horizontal direction. The other of the two parts, i.e., the vertical gate electrode 142b, is formed on the side surfaces of the first impurity region 130N and extends along the vertical direction. The transfer gate 140 as suggested in the disclosed technology may extend to cover not only the top surface of the photoelectric conversion element 130, but also the side surfaces of the photoelectric conversion element 130, such that photocharges (electrons) generated in a lower region of the first impurity region 130N can also easily move to the floating diffusion (FD) region. For example, as depicted in the dotted arrows of FIG. 3, the electrons located in the lower region of the first impurity region 130N can also easily move upward by the vertical gate electrode 142b through a channel region formed on a side surface of the photoelectric conversion element 130 and in the vertical direction. Thus, photocharges located in the lower region of the photoelectric conversion element 130 can also rapidly move to the floating diffusion (FD) region, such that transmission (Tx) capability from the photoelectric conversion element to the floating diffusion (FD) region can be greatly improved, resulting in improvement of lag characteristics of the image sensing device.

In addition, as described above, since transmission (Tx) capability of the transfer transistor can be greatly improved, it is possible to lower a potential level of the transmission signal applied to the transfer gate 140. As the potential level applied to the transfer gate 140 increases, there is a higher possibility that a potential pocket will be formed between the transfer gate 140 and the photoelectric conversion element 130. If the potential pocket is formed, some or all of photocharges accumulated in the potential pocket may move back to the photoelectric conversion element 130, such that there is a higher possibility that uniformity between the pixels will be deteriorated by an occurrence of a spillback phenomenon. Here, the spillback phenomenon may refer to that all or some parts of the photocharges transferring from the photoelectric conversion element 130 and accumulating in the potential pocket return to the photoelectric conversion element 130. The above-mentioned problem may become more serious in the dark environment. In accordance with the embodiment, the potential level of the transmission signal applied to the transfer gate 140 can be reduced, and thus it is possible to reduce or prevent the occurrence of the potential pocket. Thus, the problems associated with the potential pocket can be avoided. In addition, it is possible to reduce noise that can be generated by a high voltage applied to the transfer gate 140.

Figure 4:
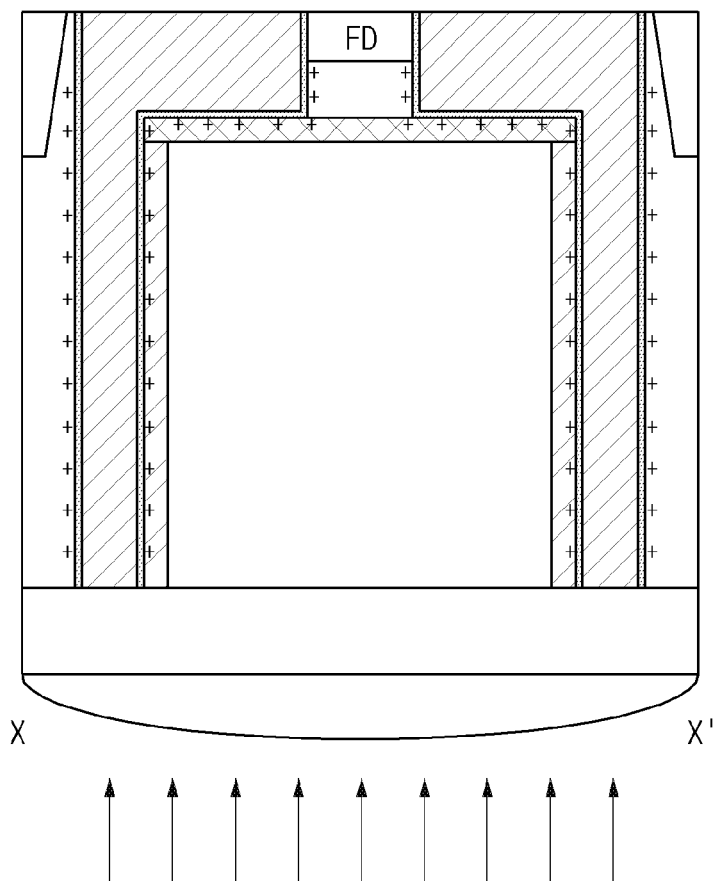
FIG. 4 is a diagram illustrating a method for accumulating holes on an interface between a transfer gate and a substrate by applying a negative voltage to the transfer gate shown in FIG. 3.

The transfer gate structure suggested in this patent document can effectively control dark electrons generated from the interface of the substrate 10 during which the image sensing device is exposed to the dark environment. For example, in the dark environment, the negative voltage is applied to the gate electrode 142 and holes (positive charges as shown with '+' in FIG. 4) can be accumulated on the substrate contacting the gate insulation film 144 as shown in FIG. 4. Thus, in the dark environment, holes are arranged to surround the photoelectric conversion element 130, such that dark electrons generated at the interface of the substrate 10 irrespective of incident light can be prevented from flowing into the photoelectric conversion element 130.

In some implementations, the vertical gate electrode 142b may be formed to pass through the substrate 10. Thus, the vertical gate electrode 142b may also operate as a Deep Trench Isolation (DTI) structure that is capable of isolating each of the photoelectric conversion elements of the unit pixels located adjacent to each other.

FIGS. 5A to 5E are example plan views illustrating a method for forming a unit pixel based on some implementations of the disclosed technology. FIGS. 6A to 6E are example cross-sectional views illustrating a unit pixel taken along the line X-X' shown in FIGS. 5A to 5E.

FIGS. 5A to 5E illustrate only one unit pixel for convenience of description.

Figure 5A:
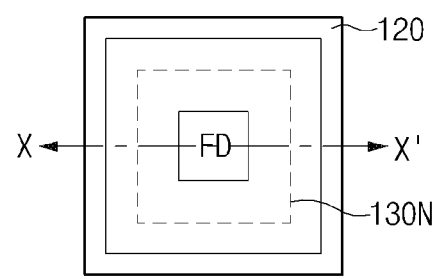
FIGS. 5A to 5E are example plan views illustrating a method for forming a unit pixel based on some implementations of the disclosed technology.
Figure 6A:
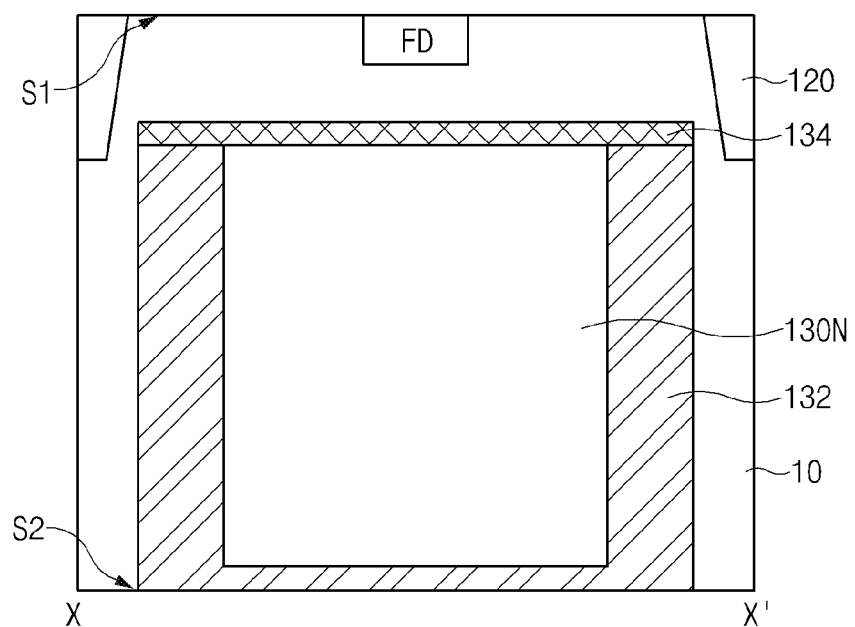
FIGS. 6A to 6E are example cross-sectional views illustrating unit pixels taken along the line X-X' shown in FIGS. 5A to 5E.

Referring to FIGS. 5A and 6A, the p-type impurity region 132 is formed in the substrate 10 including a first surface S1 and a second surface S2 opposite to the first surface S1. In some implementations, the p-type impurity region 132 may be formed by implanting P-type impurities into a region in which the gate electrode 140 and the photoelectric conversion element 130 will be formed.

Subsequently, the first impurity region 130N and the floating diffusion (FD) region are formed by implanting N-type impurities into the substrate 10 in which the P-type impurity region 132 is formed.

A support substrate (not shown) may be formed at the second surface S2 of the substrate 10. In some implementations, the support substrate and the substrate 10 may form a Silicon On Insulation (SOT) substrate. In this case, the substrate 10 may correspond to an upper substrate of a Silicon On Isolation (SOT) substrate.

The floating diffusion (FD) region may be formed in the upper region of the substrate 10 so as to contact the first surface S1 of the substrate 10. The first impurity region 130N may be spaced apart from the floating diffusion (FD) region by a predetermined distance, and may be formed in the P-type impurity region 132 in such a manner that the first impurity region 130N can be spaced apart from the second surface S2 of the substrate 10. The first impurity region 130N may be formed to have a predetermined depth where the first impurity region 130N is in contact with the second surface S2 of the substrate 10. The first impurity region 130N may have a doping profile that is uniform in the entire region, or may include a doping profile in which impurity doping density increases as being closer the first surface S1. The second surface S2 of the substrate 10 may be used as an incident surface at which incident light arrives.

Subsequently, P-type impurities are additionally implanted into a region between the first impurity region 130N and the floating diffusion (FD) region. Thus, a P-type impurity region 134 for isolating the first impurity region 130N from the floating diffusion (FD) region can be formed. The P-type impurity regions 132 and 134 may be formed to have the same density, or may also be formed to have different densities.

In some implementations, the P-type impurity region 134 may be formed in other ways. For example, when forming the P-type impurity region 132, after impurities are implanted with the height of the P-type impurity region 134, N-type impurities are further implanted into the impurity-implantation resultant structure to form the first impurity region 130N.

In some implementations, the P-type impurity regions 132 and 134 may be formed to extend to overlap with the device isolation structure 120 which is to be formed in a subsequent process.

The device isolation trench may be formed by, for example, etching the first surface S1 of the substrate 10 to a predetermined depth. Thereafter, the insulation material may be buried in the device isolation trench. By doing so, a device isolation structure 120 is formed, which defines the active region (see 110 of FIG. 2) in which the transistors RX, DX, and SX are formed and the pixel region in which the unit pixels PX1 to PX4 are formed. The device isolation structure 120 may include a shallow trench isolation (STI) structure.

Figure 5B:
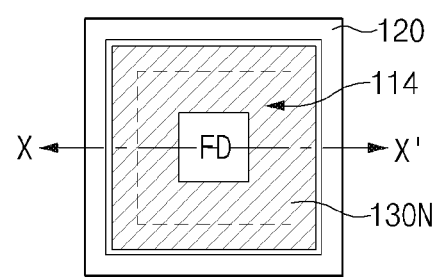
Figure 6B:
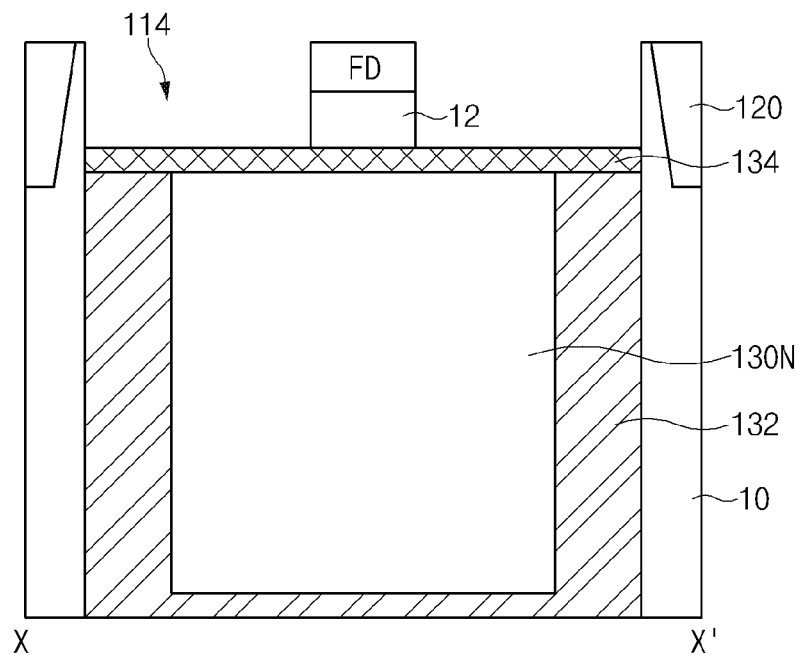

Referring to FIGS. 5B and 6B, an etching is performed on a region between the floating diffusion (FD) region and the device isolation structure 120. The etching may be performed to a predetermined depth from the first surface S1 of the substrate, resulting in formation of a first trench 114.

For example, the first trench 114 may be formed to surround the floating diffusion (FD) region when viewed in a plan view. Thus, the first trench 114 may be formed around the floating diffusion (FD) region and the pillar region 12 formed below the floating diffusion (FD) region. The etching to form the first trench 114 may be performed to a predetermined thickness. For example, the etching is performed until the bottom surface of the trench is in contact with the P-type impurity region 134. After the formation of the first trench 114, the floating diffusion (FD) region and the pillar region 12 may protrude from the P-type impurity region 134. With the formation of the first trench 114, the pixel region has an etched area at the periphery of the floating diffusion (FD) region.

Figure 5C:
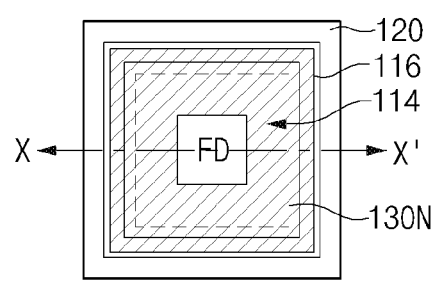
Figure 6C:
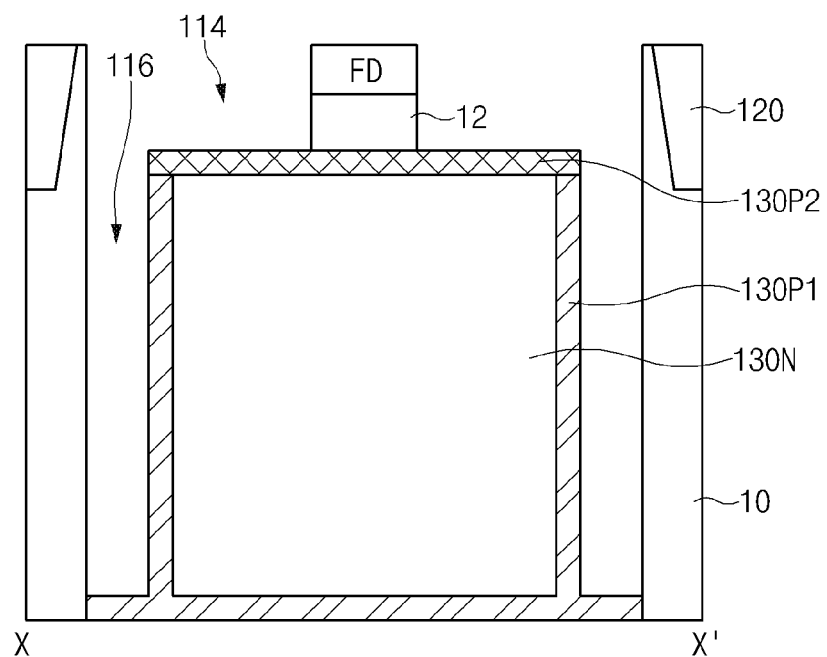

Referring to FIGS. 5C and 6C, a second trench 116 is formed by etching parts of the P-type impurity regions 132 and 134. The region to be etched does not overlap with the first impurity region 130N. The remaining parts of the P-type impurity regions 132 and 134 form the second impurity region 130P1 and the third impurity region 130P2, respectively.

The second trench 116 has a bottom surface located at a substantially identical level as the bottom surface of the first impurity region 130N. The second trench 116 and the first impurity region 130N may be spaced apart from each other by a predetermined distance. The P-type impurity region 130P1 may be formed between the second trench 116 and the first impurity region 130N. The top surface and the side surfaces of the first impurity region 130N are surrounded with the P-type impurity regions 130P1 and 130P2, each of which has a predetermined thickness.

Figure 5D:
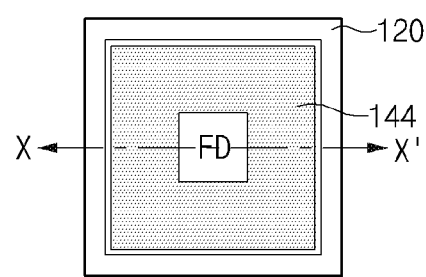
Figure 6D:
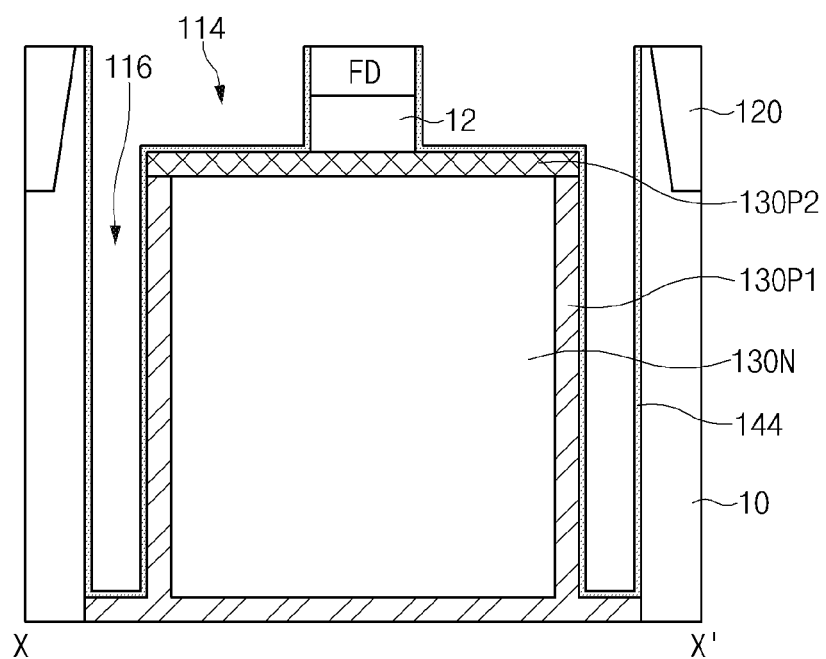

Referring to FIGS. 5D and 6D, the gate insulation film 144 may be formed at the bottom surface and side surfaces of the first trench 114 and the second trench 116.

For example, the first trench 114 and the second trench 116 may be annealed in a manner that the side and bottom surfaces of the first trench 114 and the second trench 116 can be oxidized, resulting in formation of an oxide film. Alternatively, through a deposition process, the insulation film may be deposited over the side and bottom surfaces of the first trench 114 and the second trench 116, resulting in formation of the gate insulation film 114.

Figure 5E:
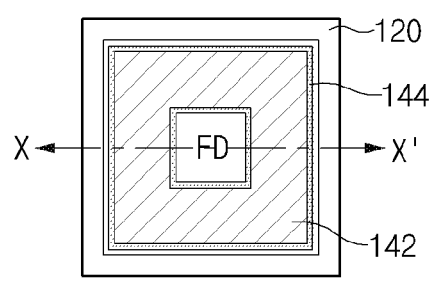
Figure 6E:
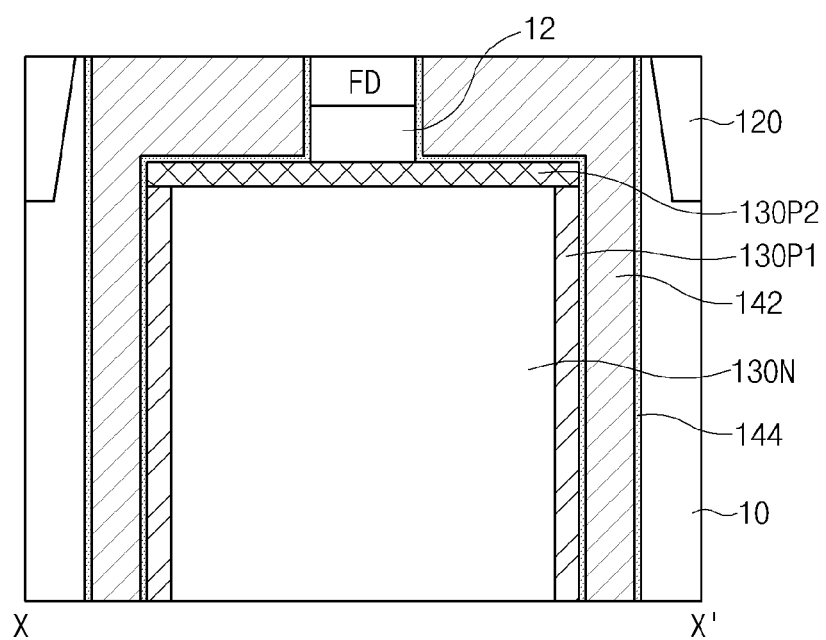

Referring to FIGS. 5E and 6E, the gate electrode 142 may be formed over the gate insulation film 114 so as to fill or bury the first trench 114 and the second trench 116.

For example, after a gate electrode material is formed over the gate insulation film 114 so as to fill or bury the first trench 114 and the second trench 116, the gate electrode material may be planarized to expose the floating diffusion (FD) region, resulting in formation of the gate electrode 142.

The gate electrode 140 may include a silicon-containing semiconductor material (e.g., polysilicon) or a metal material.

Subsequently, the second surface S2 of the substrate 10 may be etched and planarized until the gate electrode 142 is exposed outside.

Thereafter, the color filter layer and the microlens may be formed over the second surfaced S2 of the substrate 10.

As is apparent from the above description, the image sensing device based on some embodiments of the disclosed technology may form a transfer gate having a shape to surround the photoelectric conversion element, the pillar region 12 and the floating diffusion (FD) region. The transfer gate may have two parts extending along two different directions. Since the transfer gate is formed to surround the photoelectric conversion element along the top surface and the side surface of the photoelectric conversion element, the transmission (Tx) capability from the photoelectric conversion element to the floating diffusion (FD) region can increase, which results in improvement of lag characteristics.

The image sensing device based on some implementations of the disclosed technology can lower the magnitude of voltage needed to be applied to the transfer gate by improving transmission (Tx) capability. As a result, the image sensing device based on some implementations of the disclosed technology can reduce noise caused by a high voltage, and can also reduce a potential pocket problem (e.g., non-uniformity between pixels in the dark environment).

The image sensing device based on some implementations of the disclosed technology can accumulate many more holes on a gate insulation film of the transfer gate by applying a negative voltage to the transfer gate in the dark environment. As a result, the image sensing device based on some implementations of the disclosed technology can prevent unexpected electrons generated from a silicon interface from flowing into the photoelectric conversion element, resulting in improvement of dark characteristics.

Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination. Only a few implementations and examples are described and other implementations, enhancements and variations can be made based on what is described and illustrated in this patent document.

What is claimed is:
1. An image sensing device, comprising:
a photoelectric conversion element disposed in a substrate, and configured to generate photocharges in response to incident light;

a floating diffusion (FD) region disposed over the photoelectric conversion element and configured to store the photocharges generated by the photoelectric conversion element; and a transfer gate configured to transfer the photocharges generated by the photoelectric conversion element to the floating diffusion (FD) region in response to a transmission signal, wherein the transfer gate includes:

a horizontal gate disposed over the photoelectric conversion element; and a vertical gate disposed on a side of the photoelectric conversion element to surround the photoelectric conversion element, wherein the entire floating diffusion (FD) region is disposed to overlap with the photoelectric conversion element.

2. The image sensing device according to claim 1, wherein the photoelectric conversion element includes:

a first impurity region including first-type impurities; and a second impurity region interposed between the transfer gate and the first impurity region and including second-type impurities different from the first-type impurities.

3. The image sensing device according to claim 2, wherein an impurity doping density of the first impurity region increases as being closer to the floating diffusion (FD) region.

4. The image sensing device according to claim 2, wherein:

the first impurity region includes an N-type impurity region, and the second impurity region includes a P-type impurity region.

5. The image sensing device according to claim 1, wherein the horizontal gate is located on a side of the floating diffusion (FD) region to surround the floating diffusion (FD) region in a band shape.

6. An image sensing device, comprising:

a photoelectric conversion element disposed in a substrate, and configured to generate photocharges in response to incident light;

a floating diffusion (FD) region disposed over the photoelectric conversion element and configured to store the photocharges generated by the photoelectric conversion element; and a transfer gate configured to transfer the photocharges generated by the photoelectric conversion element to the floating diffusion (FD) region in response to a transmission signal, wherein the transfer gate includes:

a horizontal gate disposed over the photoelectric conversion element; and a vertical gate disposed on a side of the photoelectric conversion element to surround the photoelectric conversion element, and wherein the photoelectric conversion element, the floating diffusion (FD) region, and the transfer gate are disposed in a pixel region and the floating diffusion (FD) region is disposed at a central region of the pixel region.

7. The image sensing device according to claim 1, wherein the vertical gate has a barrier shape and coupled to the horizontal gate.

8. The image sensing device according to claim 1, wherein the vertical gate is disposed to pass through the substrate.

9. The image sensing device according to claim 1, wherein the transfer gate is configured to cover a top surface and side surfaces of the photoelectric conversion element.

10. The image sensing device according to claim 1, wherein the transfer gate is disposed along a direction perpendicular to a surface of the substrate and configured to surround an entire side surface of the photoelectric conversion element.

11. The image sensing device according to claim 1, wherein a top surface of the transfer gate and a top surface of the floating diffusion (FD) region are located at the same level.

12. An image sensing device, comprising:

a photoelectric conversion element disposed in a substrate;

a floating diffusion (FD) region disposed over the photoelectric conversion element and disposed to overlap with a central region of the photoelectric conversion element; and a transfer gate disposed to surround top and side surfaces of the photoelectric conversion element and surround side surfaces of the floating diffusion (FD) region, the transfer gate configured to transfer photocharges generated by the photoelectric conversion element to the floating diffusion (FD) region in response to a transmission signal.

13. The image sensing device according to claim 12, wherein the transfer gate includes:

a horizontal gate disposed over the photoelectric conversion element to surround the floating diffusion (FD) region; and a vertical gate coupled to the horizontal gate and disposed on a side of the photoelectric conversion element, the vertical gate configured to surround the photoelectric conversion element.

14. The image sensing device according to claim 13, wherein the horizontal gate includes a through-hole formed at a central region of the horizontal gate.

15. The image sensing device according to claim 14, wherein the floating diffusion (FD) region is located in the through-hole.

16. The image sensing device according to claim 13, wherein the vertical gate has a barrier shape passing through the substrate.

17. The image sensing device according to claim 13, wherein the horizontal gate and the vertical gate are disposed in the substrate.

18. The image sensing device of claim 12, further including a color filter layer formed on a first surface of the substrate, the first surface being opposite to a second surface of the substrate that is in contact with the floating diffusion (FD) region.

19. The image sensing device of claim 18, further including a microlens formed on the color filter layer and configured to focus incident light.

20. The image sensing device according to claim 6, further including a color filter layer formed on a first surface of the substrate, the first surface being opposite to a second surface of the substrate that is in contact with the floating diffusion (FD) region.

* * * * *